(12) United States Patent
Agarwal et al.

(10) Patent No.: US 11,322,416 B2
(45) Date of Patent: May 3, 2022

(54) CONTROLLER FOR CONTROLLING CORE CRITICAL DIMENSION VARIATION USING FLASH TRIM SEQUENCE

(71) Applicant: Lam Research Corporation, Fremont, CA (US)

(72) Inventors: Pulkit Agarwal, Beaverton, OR (US); Adrien LaVoie, Newberg, OR (US); Ravi Kumar, Providence, RI (US); Purushottam Kumar, Hillsboro, OR (US)

(73) Assignee: Lam Research Corporation, Fremont, CA (US)

( * ) Notice: Subject to any disclaimer, the term of this patent is extended or adjusted under 35 U.S.C. 154(b) by 2 days.

(21) Appl. No.: 16/935,137

(22) Filed: Jul. 21, 2020

(65) Prior Publication Data
US 2020/0350219 A1    Nov. 5, 2020

Related U.S. Application Data

(62) Division of application No. 16/044,444, filed on Jul. 24, 2018, now Pat. No. 10,727,143.

(51) Int. Cl.
*H01J 37/32* (2006.01)
*H01L 21/66* (2006.01)
*H01L 21/027* (2006.01)

(52) U.S. Cl.
CPC ........ *H01L 22/26* (2013.01); *H01J 37/32449* (2013.01); *H01J 37/32522* (2013.01); *H01J 37/32926* (2013.01); *H01J 37/32963* (2013.01); *H01L 21/0274* (2013.01); *H01J 2237/327* (2013.01); *H01J 2237/3321* (2013.01); *H01J 2237/3341* (2013.01)

(58) Field of Classification Search
None
See application file for complete search history.

(56) References Cited

U.S. PATENT DOCUMENTS

2003/0165755 A1* 9/2003 Mui .................. H01L 22/20 430/30
2017/0256417 A1* 9/2017 Chou ................ H01L 21/02164

* cited by examiner

*Primary Examiner* — Jay C Chang
(74) *Attorney, Agent, or Firm* — Penilla IP, APC

(57) ABSTRACT

A pattern of core material is formed on a wafer to include core features that have a critical dimension. A trim amount indicates an average amount of thickness to be removed from vertically oriented surfaces of the core features. A trim profile indicates how much variation in removal of thickness from vertically oriented surfaces of the core features is to be applied as a function of radial location on the wafer. A first set of data correlates the trim amount to one or more plasma trim process parameters. A second set of data correlates the trim profile to one or more plasma trim process parameters. Based on the trim amount, trim profile, and first and second sets of data, a set of plasma trim process parameters to achieve the trim amount and trim profile on the wafer is determined and a corresponding plasma trim process is performed on the wafer.

20 Claims, 9 Drawing Sheets

601 — Having multiple wafers, with a pattern of a core material formed on each of the multiple wafers, with the pattern of the core material including core features that have a critical dimension as measured in a horizontal direction, where the horizontal direction is substantially parallel to a bottom surface of a given wafer.

↓

603 — For each of the multiple wafers, receive a target trim amount as an input parameter, where each of the multiple wafers have a respective target trim amount, with the target trim amount for a particular wafer indicating an average amount of thickness to be removed from vertically oriented surfaces of the core features of the particular wafer.

↓

605 — For each of the multiple wafers, receive a target trim profile as an input parameter, where each of the multiple wafers have a respective target trim profile, with the target trim profile for the particular wafer indicating how much variation in removal of thickness from the vertically oriented surfaces of the core features is to be applied as a function of radial location on the particular wafer between a center of the particular wafer and a peripheral edge of the particular wafer when performing the target trim amount on the particular wafer.

↓

607 — For each of the multiple wafers, access a first set of data that correlates an amount of trim for the particular wafer to one or more plasma trim process parameters, where the first set of data is applicable to a specific plasma processing station in which the particular wafer is to be processed.

↓

609 — For each of the multiple wafers, access a second set of data that correlates a profile of trim for the particular wafer to one or more plasma trim process parameters, wherein the second set of data is applicable to the specific plasma processing station in which the particular wafer is to be processed.

↓

611 — Based on the target trim amount and the target trim profile for each of the multiple wafers and on the first and second sets of data for each of the plasma processing stations, determine a base set of plasma trim process parameters for use in a base trim process on each of the multiple wafers, wherein the base trim process is the same for each of the multiple wafers.

↓

613 — Based on the target trim amount and the target trim profile for each of the multiple wafers, and on the first and second sets of data for each of the plasma processing stations, and on the base set of plasma trim process parameters, determine a respective supplemental set of plasma trim process parameters for each of the multiple wafers for use in a respective flash trim process on each of the multiple wafers to achieve the target trim amount for the particular wafer and target trim profile for the particular wafer, where the flash trim process is customized for each of the multiple wafers.

↓

615 — Perform the base trim process on each of the multiple wafers in the specific plasma processing station in which the particular wafer is to be processed.

↓

617 — After completion of the base trim process, perform the respective flash trim process on each of the multiple wafers in the specific plasma processing station in which the particular wafer is to be processed.

Fig. 6

CONTROLLER FOR CONTROLLING CORE CRITICAL DIMENSION VARIATION USING FLASH TRIM SEQUENCE

CLAIM OF PRIORITY

This application is a divisional application under 35 U.S.C. 120 of prior U.S. application Ser. No. 16/044,444, filed Jul. 24, 2018, the disclosure of which is incorporated herein by reference in their entirety for all purposes.

BACKGROUND

1. Field of the Disclosure

The present disclosure relates to semiconductor device fabrication.

2. Description of the Related Art

Plasma etching processes are often used in the manufacture of semiconductor devices. In the plasma etching process, a semiconductor wafer that includes semiconductor devices under manufacture is exposed to a plasma that interacts with at least one material on the semiconductor wafer so as to remove the at least one material. The plasma can be generated using specific reactant gases that will cause constituents of the plasma to interact with the material(s) to be removed from the semiconductor wafer, without significantly interacting with other materials on the wafer that are not to be removed. Also, in some plasma etching processes, a bias voltage can be applied to the semiconductor wafer to enable anisotropic etching of features on the semiconductor wafer by attracting charged constituents of the plasma toward the semiconductor wafer in a more perpendicular direction. It is within this context that the present disclosure arises.

SUMMARY

In an example embodiment, a method is disclosed for controlling core critical dimension. The method includes having a wafer with a pattern of a core material formed on the wafer. The pattern of the core material includes one or more core features that have a critical dimension as measured in a horizontal direction. The horizontal direction is parallel to a bottom surface of the wafer. The method includes receiving a target trim amount as an input parameter. The target trim amount indicates an average amount of thickness to be removed from vertically oriented surfaces of the one or more core features. The method also includes receiving a target trim profile as an input parameter. The target trim profile indicates how much variation in removal of thickness from vertically oriented surfaces of the one or more core features is to be applied as a function of radial location on the wafer between a center of the wafer and a peripheral edge of the wafer when performing the target trim amount on the wafer. The method also includes accessing a first set of data that correlates an amount of trim to one or more plasma trim process parameters. The method also includes accessing a second set of data that correlates a profile of trim to one or more plasma trim process parameters. The method also includes determining a set of plasma trim process parameters to be used to achieve the target trim amount and target trim profile on the wafer, based on the target trim amount, the target trim profile, the first set of data, and the second set of data. The method also includes performing a plasma trim process on the wafer using the set of plasma trim process parameters to create a modified pattern of the core material that includes the one or more core features having a revised critical dimension as measured in the horizontal direction.

In an example embodiment, a method is disclosed for controlling core critical dimension. The method includes having multiple wafers, with a pattern of a core material formed on each of the multiple wafers. The pattern of the core material includes core features that have a critical dimension as measured in a horizontal direction, where the horizontal direction is substantially parallel to a bottom surface of a given wafer. The method also includes receiving a target trim amount as an input parameter for each of the multiple wafers. Each of the multiple wafers has a respective target trim amount. The target trim amount for a particular wafer indicates an average amount of thickness to be removed from vertically oriented surfaces of the core features of the particular wafer. The method also includes receiving a target trim profile as an input parameter for each of the multiple wafers. Each of the multiple wafers has a respective target trim profile. The target trim profile for the particular wafer indicates how much variation in removal of thickness from the vertically oriented surfaces of the core features is to be applied as a function of radial location on the particular wafer between a center of the particular wafer and a peripheral edge of the particular wafer when performing the target trim amount on the particular wafer. The method also includes, for each of the multiple wafers, accessing a first set of data that correlates an amount of trim for the particular wafer to one or more plasma trim process parameters. The first set of data is applicable to a specific plasma processing station in which the particular wafer is to be processed. The method also includes, for each of the multiple wafers, accessing a second set of data that correlates a profile of trim for the particular wafer to one or more plasma trim process parameters. The second set of data is applicable to the specific plasma processing station in which the particular wafer is to be processed. The method also includes determining a base set of plasma trim process parameters for use in a base trim process on each of the multiple wafers. The base set of plasma trim process parameters is determined based on the target trim amount for each of the multiple wafers, the target trim profile for each of the multiple wafers, the first set of data for the plasma processing stations, and the second set of data for the plasma processing stations. The base trim process is the same for each of the multiple wafers. The method also includes determining a respective supplemental set of plasma trim process parameters for each of the multiple wafers for use in a respective flash trim process on each of the multiple wafers to achieve the target trim amount for the particular wafer and target trim profile for the particular wafer. Determining the respective supplemental set of plasma trim process parameters for each of the multiple wafers is based on the target trim amount for each of the multiple wafers, the target trim profile for each of the multiple wafers, the first set of data for the plasma processing stations, the second set of data for the plasma processing stations, and the base set of plasma trim process parameters. The flash trim process is customized for each of the multiple wafers. The method also includes performing the base trim process on each of the multiple wafers in the specific plasma processing station in which the particular wafer is to be processed. The method also includes, after completion of the base trim process, performing the respective flash trim process on each of the multiple wafers in the specific plasma processing station in which the particular wafer is to be processed.

In an example embodiment, a controller for controlling core critical dimension is disclosed. The controller includes an input module configured to obtain a target trim amount as an input parameter. The target trim amount indicates an average amount of thickness to be removed from vertically oriented surfaces of core features on a wafer. The core features form part of a pattern of a core material on the wafer. The core features have a critical dimension as measured in a horizontal direction parallel to a bottom surface of the wafer. The input module is configured to obtain a target trim profile as an input parameter. The target trim profile indicates how much variation in removal of thickness from vertically oriented surfaces of the core features is to be applied as a function of radial location on the wafer between a center of the wafer and a peripheral edge of the wafer when performing the target trim amount on the wafer. The input module is configured to obtain a first set of data that correlates an amount of trim to one or more plasma trim process parameters. The input module is configured to obtain a second set of data that correlates a profile of trim to one or more plasma trim process parameters. The controller also includes an analysis module configured to determine a set of plasma trim process parameters to be used to achieve the target trim amount and target trim profile on the wafer based on analysis of the first set of data and the second set of data. The controller also includes an execution module configured to direct performance of a plasma trim process on the wafer using the set of plasma trim process parameters to create a modified pattern of the core material that includes the core features having a revised critical dimension as measured in the horizontal direction.

In an example embodiment, a method is disclosed for controlling core critical dimension on multiple wafers. The method includes having multiple wafers, with a pattern of a core material formed on each of the multiple wafers. The pattern of the core material includes core features that have a critical dimension as measured in a horizontal direction. The horizontal direction is substantially parallel to a bottom surface of a given wafer. Each of the multiple wafers is present in a separate one of multiple plasma processing stations. The method also includes performing a base trim process on each of the multiple wafers in a simultaneous manner in the multiple plasma processing stations. The base trim process is defined to reduce the critical dimension of the core features on the multiple wafers. The base trim process is performed in a same manner in each of the multiple plasma processing stations. The method also includes, after completion of the base trim process, performing a wafer-specific flash trim process on each of the multiple wafers in the multiple plasma processing stations. The wafer-specific flash trim process is defined to further reduce the critical dimension of the core features on the multiple wafers. The wafer-specific flash trim process is performed in a separately defined manner in each of the multiple plasma processing stations. The wafer-specific flash trim process for a given wafer of the multiple wafers is defined so that a combination of the base trim process and the wafer-specific flash trim process for the given wafer achieves a wafer-specific target trim amount on the given wafer and achieves a wafer-specific target trim profile on the given wafer.

In an example embodiment, a method is disclosed for controlling core critical dimension. The method includes having a wafer with a pattern of a core material formed on the wafer. The pattern of the core material includes one or more core features that have a critical dimension as measured in a horizontal direction. The horizontal direction is parallel to a bottom surface of the wafer. The method includes receiving a target trim amount as an input parameter. The target trim amount indicates an average amount of thickness to be removed from vertically oriented surfaces of the one or more core features. The method also includes accessing a set of data that correlates an amount of trim to one or more plasma trim process parameters. The method includes determining, based on the target trim amount and the set of data, a set of plasma trim process parameters to be used to achieve the target trim amount on the wafer. The method also includes performing a plasma trim process on the wafer using the set of plasma trim process parameters to create a modified pattern of the core material that includes the one or more core features having a revised critical dimension as measured in the horizontal direction.

BRIEF DESCRIPTION OF THE DRAWINGS

FIG. 6 shows a flowchart of a method for controlling core critical dimension, in accordance with some embodiments.

DETAILED DESCRIPTION

In the following description, numerous specific details are set forth in order to provide an understanding of embodiments of the present disclosure. It will be apparent, however, to one skilled in the art that embodiments the present disclosure may be practiced without some or all of these specific details. In other instances, well known process operations have not been described in detail in order not to unnecessarily obscure the present disclosure.

In semiconductor wafer ("wafer" hereafter) fabrication, a layer of a core material can be deposited on the wafer and patterned for use as a mask in processing one or more underlying materials on/within the wafer. In various embodiments, the wafer may vary in form, shape, and/or size. For example, in some embodiments, the wafer referred to herein may correspond to a 200 mm (millimeter) diameter semiconductor wafer, a 300 mm diameter semiconductor wafer, or a 450 mm diameter semiconductor wafer. Also, in some embodiments, the wafer referred to herein may have a non-circular shape, such as a rectangular substrate for a flat panel display, or the like, among other shapes.

The layer of core material is exposed to a pattern of light transmitted through a reticle and onto the wafer in a photolithography process so that core material can be developed into a prescribed pattern of features, where some of the core features have a critical dimension. The critical dimension in this context refers a smallest dimension that is to be controlled in the particular fabrication process. The critical dimension of core features is controlled by the capabilities of the photolithography process that is used to pattern the layer of core material. There is a limit to how much the critical dimension of core features can be reduced using standard photolithography processes, e.g., using photolithography based on 193 nanometer light. Attempting to create core features that have too small of a critical dimension can cause problems in patterning the layer of core material using standard photolithography processes. Therefore, the standard photolithography processes effectively limit how small the critical dimension of core features can be made. However, once core features are formed at the smallest critical dimension that the photolithography process can accurately provide, it is possible to use the core features to fabricate even smaller critical dimension features by performing a series of etching processes to create masks that have features based on the photolithography-patterned core features. Such etching processes include self-aligned multiple patterning (SAMP) processes, and can include self-aligned double patterning (SADP) processes and self-aligned quadruple patterning (SAQP) processes, among others.

Figure 1A:
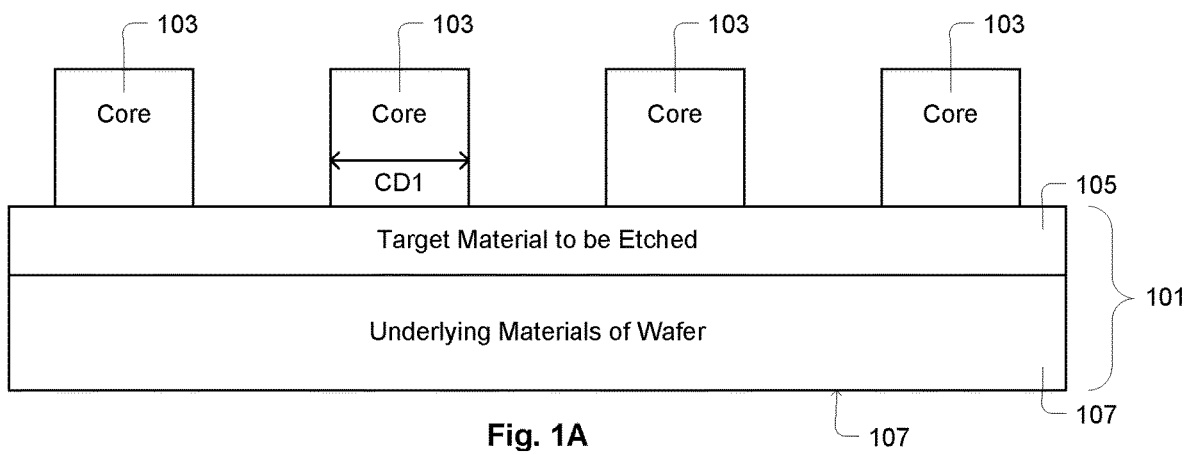
FIGS. 1A, 1B, 1C, 1D, and 1E show diagrams of a vertical cross-section through a portion of a wafer undergoing a number of operations in a SADP process, in accordance with some embodiments.
Figure 1B:
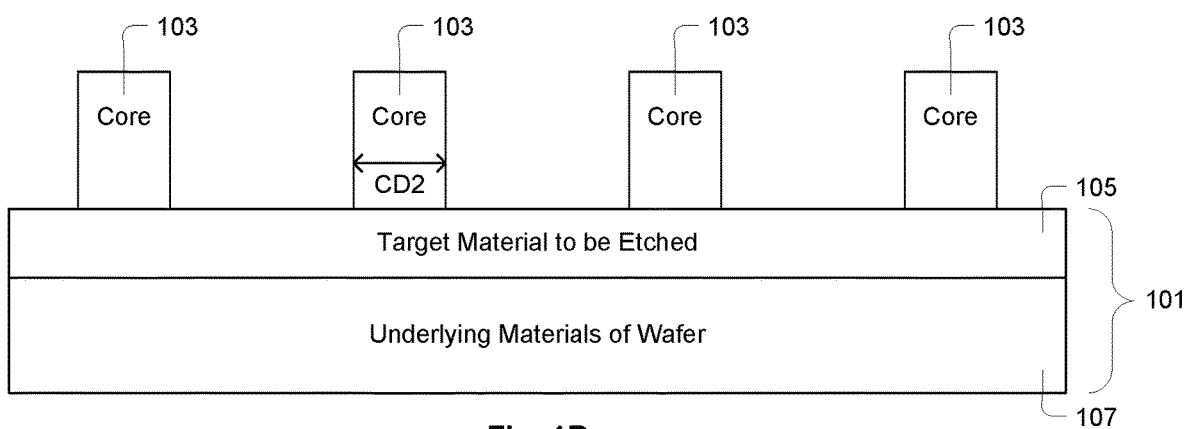

FIGS. 1A-1E show diagrams of a vertical cross-section through a portion of a wafer 101 undergoing a number of operations in a SADP process, in accordance with some embodiments. FIG. 1A shows a diagram of the vertical cross-section through the portion of the wafer 101 in which a layer of a target material 105 to be etched is deposited over wafer 101, i.e., over underlying materials 107 of the wafer 101. FIG. 1A also shows patterned core features 103 formed on the target material 105. In various embodiments, the core features 103 can be formed of a photoresist material or a carbon material, such as spin-on carbon, chemical vapor deposition (CVD) carbon, plasma enabled chemical vapor deposition (PECVD) carbon, or flowable carbon mixture, among others. The core features 103 have a critical dimension CD1 as measured in a horizontal direction substantially parallel to a bottom surface 102 of the wafer 101. In some contexts, the patterned core features 103 can be referred to as a core mandrel. In some embodiments, the critical dimension CD1 of the core features 103 can be fabricated at the smallest size that the photolithography process can accurately provide. From the configuration shown in FIG. 1A, the SADP process continues with a core trim process in which the core features 103 are laterally trimmed in a plasma etching process. In some embodiments, the plasma etching process is an oxygen-based plasma etching process. However, in other embodiments, the plasma etching process can use essentially any process gas that is suitable for etching the core feature 103 material. FIG. 1B shows the diagram of the vertical cross-section through the portion of the wafer 101 of FIG. 1A following the core trim process in which the core features 103 are laterally trimmed. FIG. 1B shows that after the core trim process, the critical dimension CD1 of the core features 103 is reduced to a smaller critical dimension CD2, i.e., CD2<CD1. In various embodiments, the core trim process can be performed using a suitably defined and controlled plasma etching process.

Figure 1C:
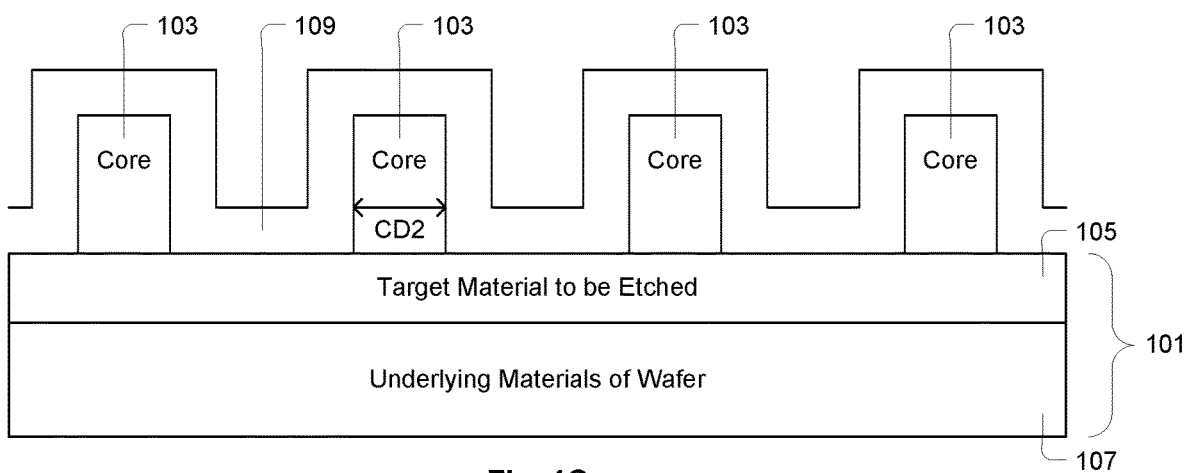

From the configuration shown in FIG. 1B, the SADP process continues with conformal deposition of a mask material 109, e.g., an oxide material, over the core features 103. FIG. 1C shows the diagram of the vertical cross-section through the portion of the wafer 101 of FIG. 1B following conformal deposition of the mask material 109 over the core features 103. In some embodiments, the mask material 109 is deposited using an atomic layer deposition process. From the configuration shown in FIG. 1C, the SADP process continues with a plasma etching process in which a top portion of the mask material 109 is removed to reveal the underlying core features 103 and in which the core features 103 are removed. In some embodiments, the plasma etching process for removing the top portion of the mask material 109 and the core features 103 can be an anisotropic etching process defined to remove materials in a substantially top-down manner. Following the plasma etching process for removing the top portion of the mask material 109 and the core features 103, side-spacers of the mask material 109 remain on the wafer 101.

Figure 1D:
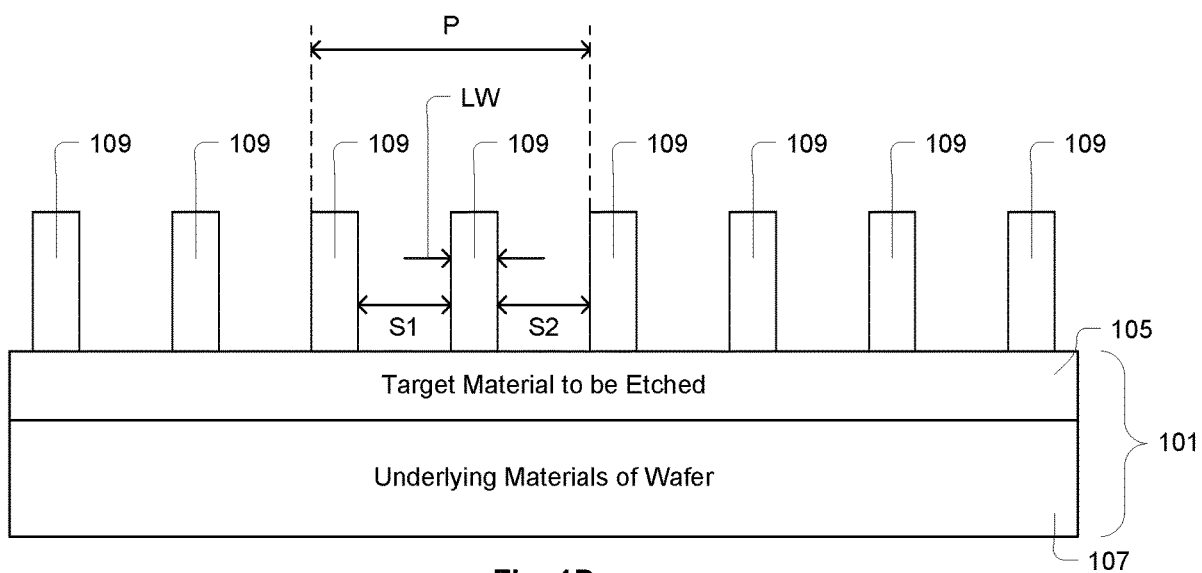
Figure 1E:
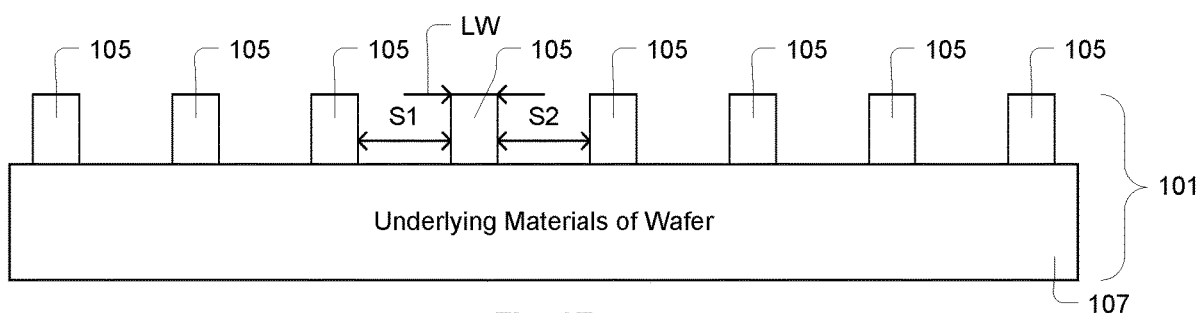

FIG. 1D shows the diagram of the vertical cross-section through the portion of the wafer 101 of FIG. 1C following the plasma etching process to remove the top portion of the mask material 109 and the core features 103 to form side-spacers of the mask material 109. The side-spacers of the mask material have a thickness LW as measured in the horizontal direction. The thickness LW can be referred to as the line width. As shown in FIG. 1D, a pitch P is defined as the sum of two times the horizontal thickness LW of the side-spacers of the mask material 109a, and a first spacing S1, and a second spacing S2. As shown in FIG. 1D, within a given pitch P, there are two side-spacers of the mask material 109 having the horizontal thickness LW. The first spacing S1 is a function of the core trim process and of core feature 103 material consumption during the conformal deposition of the mask material 109. The second spacing S2 is a function of the first spacing S1 and of the horizontal thickness LW of the side-spacers of the mask material 109. The side-spacers of the mask material 109 are used as a mask to plasma etch features into the target material 105. FIG. 1E shows the diagram of the vertical cross-section through the portion of the wafer 101 of FIG. 1D following the plasma etching process to form features from the target material 105.

It is desired that the first spacing S1 be substantially equal to the critical dimension CD2 of the core features 103 following the core trim process. And, it is desirable that the second spacing S2 be substantially equal to the first spacing S1. A variation in the critical dimension CD1, CD2 of the core features 103 across the wafer 101 is referred to as critical dimension non-uniformity (CDNU). It is desired that CDNU be minimized across the wafer 101. Also, it should be understood that CDNU can exist within a given wafer 101 (WiW (within wafer)) and/or between different wafers 101 (WTW (wafer-to-wafer)). CDNU (WiW and WTW) can lead to device failure for some die formed on the wafer 101 and/or to variation in device performance for different die formed on different wafers 101. A critical dimension imbalance (CDIMB) is equal to the absolute value of the difference between the first spacing S1 and the second spacing S2. For example, the CDIMB for a given region/area of the wafer 101 is equal to the absolute value of the difference between the average S1 and average S2 values within the given region/area of the wafer 101. If the critical dimension CD1, CD2 of the core features 103 varies across the wafer 101, the first spacing S1 and the second spacing S2 can be different across the wafer 101 and can cause an increase in CDIMB. It is desired that the CDIMB be as close to zero as possible. It should be understood that the core trim process controls the reduced critical dimension CD2 of the core features 103 across the wafer 101, and therefore has a direct affect on the first spacing S1 and has a contributory affect on the second spacing S2. Also, if the core trim process is not uniform across the wafer 101, the reduced critical dimension CD2 of the core features 103 may not be uniform across the wafer 101, and this can lead to a non-zero CDIMB across the wafer 101.

Additionally, different plasma processing stations can provide different etching results, even if the same etch process recipe is performed in each of the different plasma processing stations. This station-to-station variation in etch results can be caused in-part by within-tolerance variations in chamber parts and/or in-part by variations in interior chamber surface conditions. Therefore, the reduced critical dimension CD2 of the core features 103 achieved by performing the core trim process in different plasma processing stations can vary from station-to-station, even if the same core trim process is performed in each station. Also, each plasma processing station can have its own WiW CDNU. Therefore, WiW CDNU can vary from station-to-station.

Methods and systems are disclosed herein for performing a core critical dimension trim process on a wafer undergoing a SAMP fabrication process to reduce and/or eliminate WiW CDNU and/or WTW CDNU. Reduction and/or elimination of WiW CDNU and/or WTW CDNU will serve to reduce and/or eliminate WiW CDIMB and/or WTW CDIMB. If it is known how the core critical dimension trim process performs beforehand with regard to CDNU (WiW and/or WTW), then it is possible to adjust the core critical dimension trim process beforehand to compensate for the CDNU. For example, if it is known that the core critical dimension trim process gives a higher etch rate at the center of the wafer than at the edge of the wafer, the core critical dimension trim process can be adjusted beforehand to lower the etch rate at the center of the wafer and/or increase the etch rate at the edge of the wafer. The methods and systems disclosed herein provide for adjusting the core critical dimension trim process to compensate for anticipated WiW CDNU and/or WTW CDNU that can occur during the SAMP fabrication process. With reference to FIGS. 1A-1E, the core critical dimension trim process can be controlled to modify the critical dimension of the core features 103 (change CD1 to CD2) in a manner that controls the first spacing S1 and the second spacing S2 that define the final mask for etching the target material 105, so that the first spacing S1 is substantially equal to the second spacing S2 (WiW and/or WTW).

Figure 2:
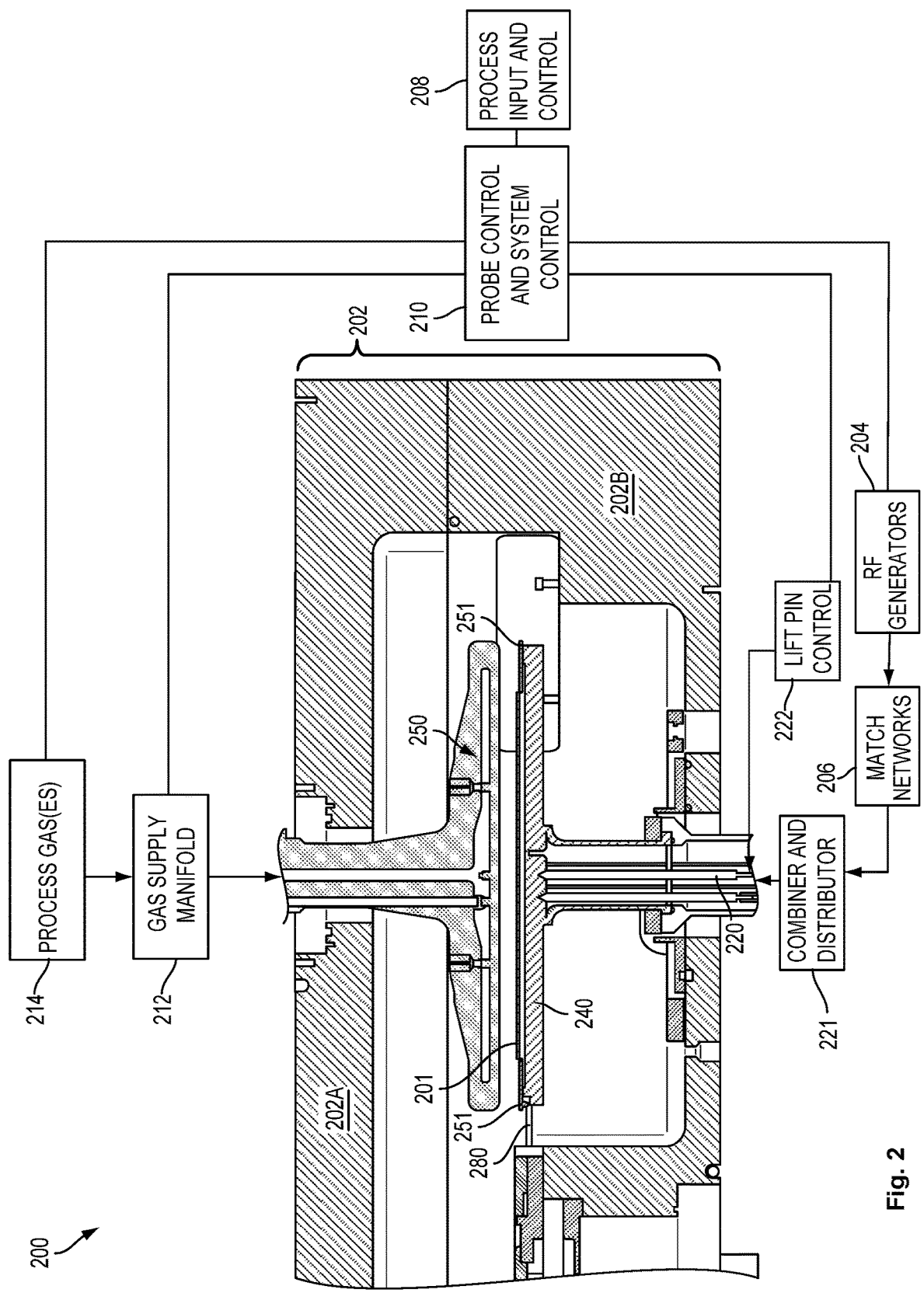
FIG. 2 shows a vertical cross-section through a plasma processing station that can be used to perform the methods disclosed herein, in accordance with some embodiments.

FIG. 2 shows a vertical cross-section through a plasma processing station 200 that can be used to perform the methods disclosed herein, in accordance with some embodiments. The plasma processing station 200 includes a plasma chamber 202 having an upper chamber portion 202A and a lower chamber portion 202B. A center column is configured to support a pedestal 240, which in one embodiment includes a powered lower electrode. The pedestal 240 is electrically coupled to a combiner and distributor 221, which is further coupled to multiple match networks 206. The match networks 206 are coupled to multiple radio frequency (RF) generators 204. The RF generators 204 are controlled by a probe control and system control 210, e.g., a controller, etc. Examples of a controller include a processor and a memory device. The processor, for example, is an application specific integrated circuit (ASIC), a programmable logic device (PLD), a central processing unit (CPU), or a microprocessor, etc. Examples of the memory device include a read-only memory (ROM), a random access memory (RAM), a redundant array of storage disks, a hard disk, a Flash memory, etc. The probe control and system control 210 operates the substrate processing system 200 by executing a process input and control specification 208. The process input and control specification 208 includes process recipes, such as power levels, timing parameters, process gasses, mechanical movement of the wafer 201, etc., so as to etch the wafer 201 and/or deposit or form films over the wafer 201.

The center column is also shown to include lift pins 220, which are controlled by a lift pin control 222. The lift pins 220 are used to raise the wafer 201 from the pedestal 240 to allow an end-effector to pick the wafer 201 and to lower the wafer 201 after being placed by the end end-effector. The substrate processing system 200 further includes a gas supply manifold 212 that is connected to process gas(es) 214, e.g., gas chemistry supplies from a facility, etc. Depending on the processing being performed, the probe control and system control 210 controls a delivery of the process gases 214 via the gas supply manifold 212. The chosen gases are then flown into a shower head 250 and are distributed in a space volume, e.g., a gap, etc., defined between the showerhead 250 face that faces that wafer 201 and the pedestal 240.

Further, in various embodiments, the process gases 214 are premixed or not. Appropriate valving and mass flow control mechanisms are employed to ensure that the correct process gases are delivered during deposition and plasma treatment phases of the process. The process gases 214 exit the plasma chamber 202 via an outlet. A vacuum pump, e.g., a one or two stage mechanical dry pump, a turbomolecular pump, etc., draws process gases out and maintains a suitably low pressure within the plasma chamber 202 by a closed loop controlled flow restriction device, such as a throttle valve or a pendulum valve.

Also shown is a carrier ring 251 that encircles an outer region of the pedestal 240. The carrier ring 251 sits over a carrier ring support region that is a step down from a wafer support region in the center of the pedestal 240. The carrier ring 251 includes an outer edge side of its disk structure, e.g., outer radius, etc., and a wafer edge side of its disk structure, e.g., inner radius, etc., that is closest to where the wafer 201 sits. The wafer edge side of the carrier ring 251 includes a plurality of contact support structures which lift the wafer 201 when the carrier ring 251 is lifted by multiple spider forks 280. The carrier ring 251 is therefore lifted along with the wafer 201 and is rotated to another station, e.g., in a multi-station system.

In some embodiments, an upper electrode within the showerhead 250 is grounded when RF power is supplied from the RF generators 204 to the lower electrode within the pedestal 240. In some embodiments, instead of the pedestal 240 being electrically coupled to the RF generators 240 via the match networks 206, the upper electrode within the showerhead 250 is coupled to the RF generators 204 via the match networks 206 for receiving power from the RF generators 204, and the lower electrode within the pedestal 240 is grounded. In some embodiments, the RF generators 204 generate RF signals having different frequencies, e.g., one of the RF generators 204 generates an RF signal having a low frequency and another one of the RF generators 204 generates an RF signal having a high frequency, which is higher than the low frequency.

Figure 3:
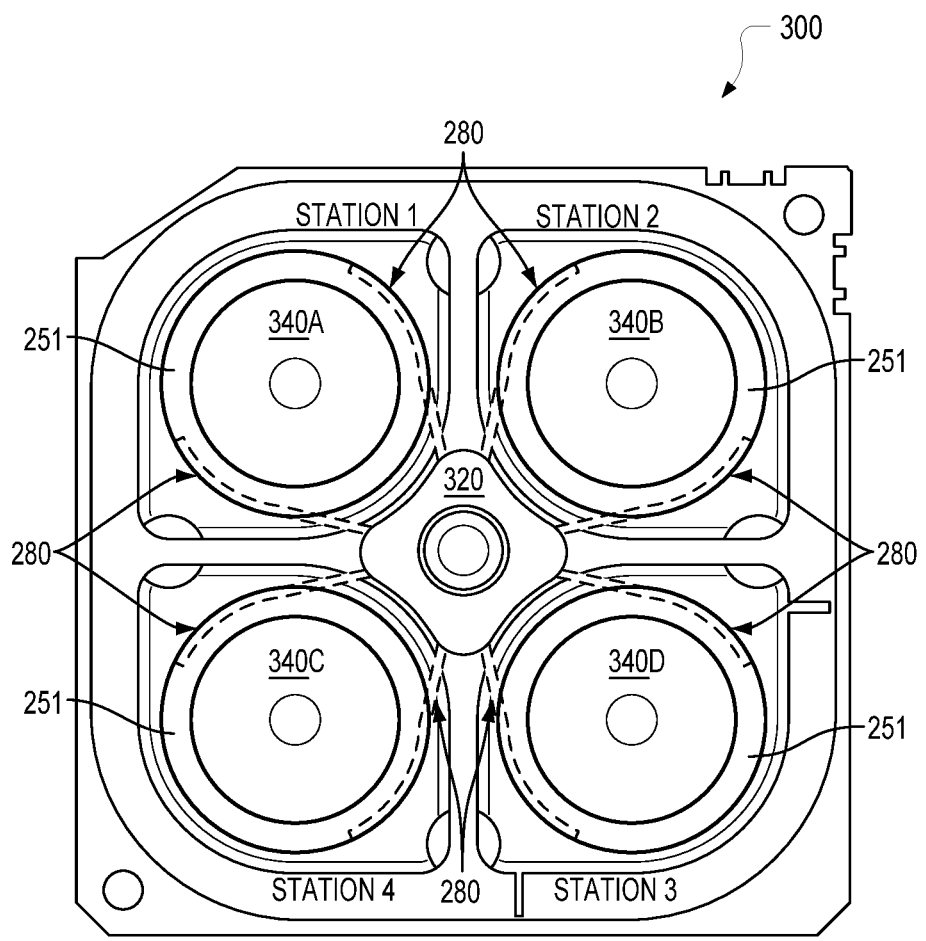
FIG. 3 shows a top view of a multi-station processing tool that includes four plasma processing stations, in accordance with some embodiments.

FIG. 3 shows a top view of a multi-station processing tool 300 that includes four plasma processing stations 340A, 340B, 340C, 340D, in accordance with some embodiments. The four plasma processing stations 340A, 340B, 340C, 340D are accessed by the spider forks 280. In one embodiment, there is no isolation wall or other mechanism to isolate one station from another. Each spider fork 280 includes a first and second arm, each of which is positioned around a portion of each side of the pedestal 240. In this view, the spider forks 280 are drawn in dash-lines, to convey that they are below the carrier ring 251. The spider forks 280, using an engagement and rotation mechanism 320, raise up and lift the carrier rings 251 from a lower surface of the carrier rings 251 from the plasma processing stations 340A, 340B, 340C, 340D simultaneously, and then rotate between two or more plasma processing stations 340A, 340B, 340C, 340D before lowering the carrier rings 251. During the rotation, at least one of the carrier rings 251 supports the wafer 201 to a next location so that further plasma processing, treatment and/or film deposition takes place on the wafer 201.

Figure 4:
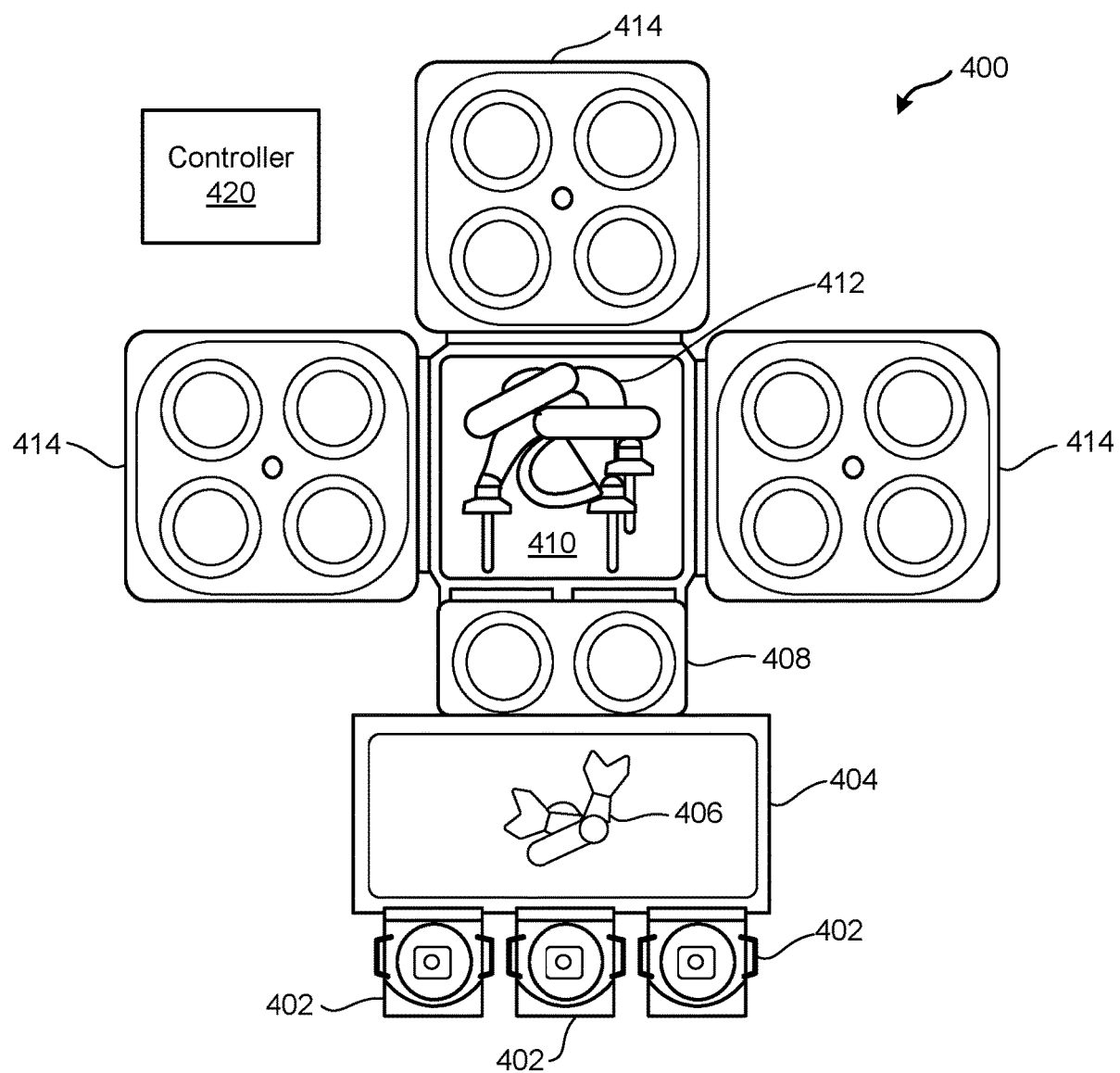
FIG. 4 shows a schematic view of the multi-station processing tool interfaced with an inbound load lock and an outbound load lock, in accordance with some embodiments.

FIG. 4 shows a cluster tool system 400 for processing substrates, in accordance with some embodiments. The cluster tool system 400 is typically installed in a fabrication facility. Transport containers 402 (e.g., front opening unitary pods (FOUP's)) are utilized to bring substrates (e.g., wafers) to and from the cluster tool system 400. An equipment front end module (EFEM) 404 includes a robot 406 configured to transfer wafers between the transport modules 402 and a loadlock 408. A transfer module 410 includes a robot 412 configured to transfer wafers between the loadlock 408 and one of several process tools 414. In some embodiments, each of the process tools 414 is the multi-station processing tool 300 having the four processing stations 340A, 340B, 340C, 340D to enable multiple wafers to be simultaneously processed. It should be understood, however, that in other embodiments each process tool 414 can include either less than or more than four processing stations.

In some embodiments, a controller 420 is part of a fabrication system that includes the cluster tool system 400. Such fabrication systems can include semiconductor processing equipment, including a processing tool or tools, chamber or chambers, a platform or platforms for processing, and/or specific processing components (a wafer pedestal, a gas flow system, etc.). These fabrication systems may be integrated with electronics for controlling their operation before, during, and after processing of a semiconductor wafer or substrate. The electronics may be referred to as the controller 420, which may control various components or subparts of the fabrication system. The controller 420, depending on the processing requirements and/or the type of fabrication system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 420 may be defined as electronics having various integrated circuits, logic, memory, and/or software that receive instructions, issue instructions, control operation, enable processing operations, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 420 in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller 420, in some implementations, may be a part of or coupled to a computer that is integrated with, coupled to the system, otherwise networked to the system, or a combination thereof. For example, the controller 420 may be in the "cloud" or all or a part of a semiconductor fabrication facility host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 420 receives instructions in the form of data, which specify parameters for each of the processing steps to be performed during one or more operations. It should be understood that the parameters may be specific to the type of process to be performed and the type of tool that the controller 420 is configured to interface with or control. Thus, as described above, the controller 420 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers. As noted above, depending on the process step or steps to be performed by the tool, the controller 420 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor fabrication facility.

It should be understood that the plasma processing stations 340A, 340B, 340C, 340D, and the cluster tool system 400 are provided by way of example. The methods disclosed herein for performing a core critical dimension trim process on a wafer undergoing a SAMP fabrication process to reduce and/or eliminate WiW CDNU and/or WTW CDNU can be performed in an equivalent manner in a suitably configured plasma processing chamber/station other than the example plasma processing stations 340A, 340B, 340C, 340D and/or cluster tool system 400.

In various embodiments, a core critical dimension trim process is used to improve WTW CDNU by compensating for incoming WTW variation in core feature 103 critical dimension CD1 due to photolithography by targeting a wafer-specific core trim amount and/or trim profile (e.g., center-to-edge) on each wafer. Similarly, variation in the reduced critical dimension CD2 of the core features 103 due to differences in performance of one plasma processing station as compared to another plasma processing station can be compensated for by targeting a wafer-specific and station-specific core trim amount and/or trim profile on each wafer. Also, WiW CDNU due to photolithography can be compensated for by defining the core critical dimension trim process to adjust WiW CDNU in further processing operations.

After photolithography is completed to form the core features 103 having the critical dimension CD1 on the incoming wafer, the incoming wafer is subjected to a measurement process in which the critical dimension CD1 of the core features 103 is measured at various locations on the incoming wafer. Then, the WiW CDNU for the incoming wafer is determined from the measured values of the critical dimension CD1 of the core features 103. Also, in some embodiments, the wafer is subjected to a measurement process after the core critical dimension trim process is completed to measure the reduced critical dimension CD2 at various locations on the wafer and determine the WiW CDNU for the reduced critical dimension CD2. The core feature 103 critical dimension measurements for the wafer are referenced to the particular plasma processing station in which the wafer was processed. Therefore, it is possible to analyze core feature 103 critical dimension measurements (CD1, CD2) for wafers for a given plasma processing station and perform station-to-station comparative analyses of core feature 103 critical dimension measurements (CD1, CD2) for wafers.

Figure 5:
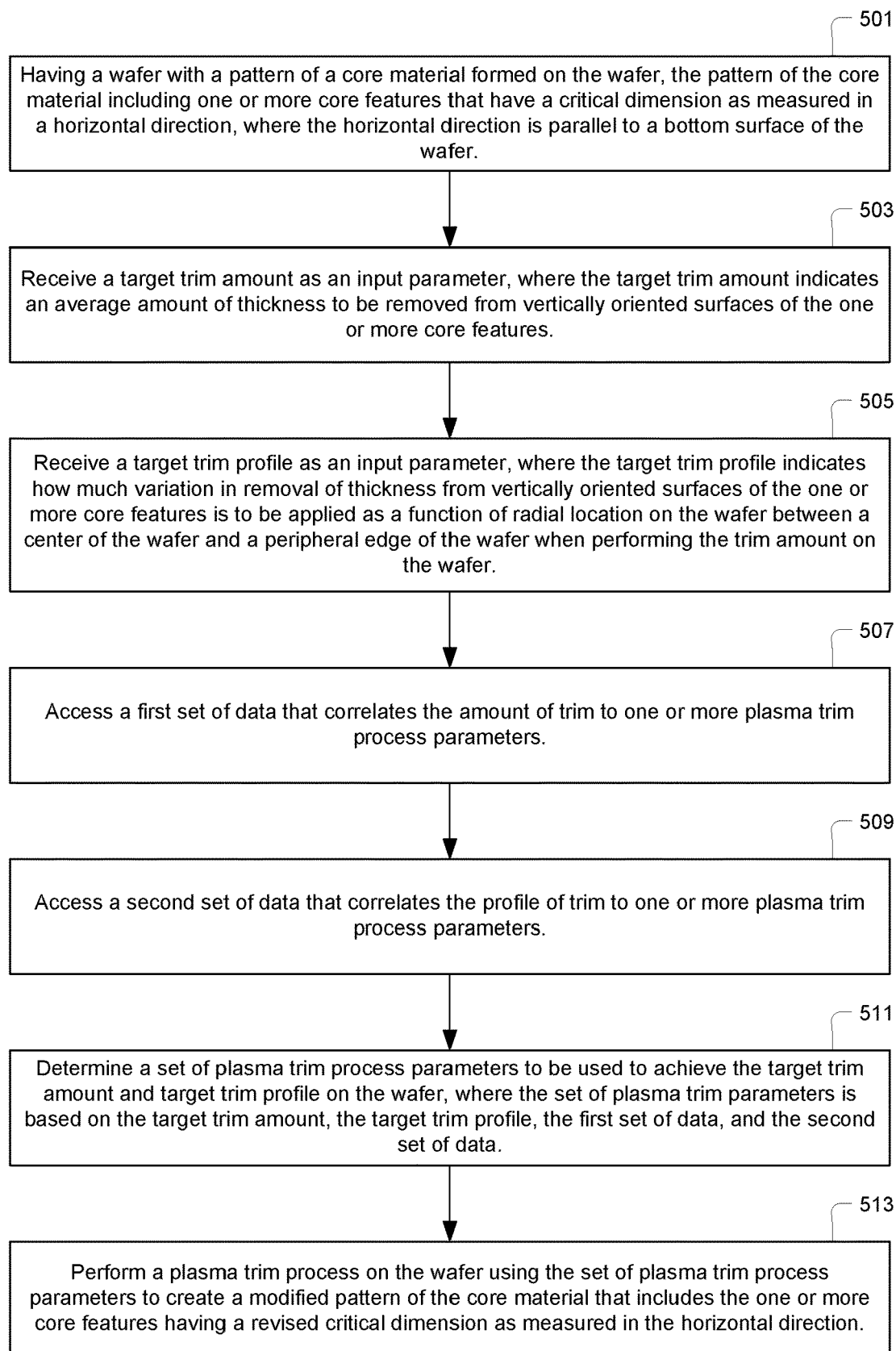
FIG. 5 shows a flowchart of a method for controlling core critical dimension, in accordance with some embodiments.

FIG. 5 shows a flowchart of a method for controlling core critical dimension, in accordance with some embodiments. The method includes an operation 501 for having a wafer with a pattern of a core material formed on the wafer. The pattern of the core material includes one or more core features, e.g., 103, that have a critical dimension, e.g., CD1, as measured in a horizontal direction, where the horizontal direction is parallel to a bottom surface of the wafer. The method also includes an operation 503 for receiving a target trim amount as an input parameter. The target trim amount indicates an average amount of thickness to be removed from vertically oriented surfaces of the one or more core features. For example, with reference to FIGS. 1A-1E, the target trim amount is the horizontal thickness of the core material that needs to be removed to go from the incoming critical dimension CD1 to the reduced critical dimension CD2. The method also includes an operation 505 for receiving a target trim profile as an input parameter. The target trim profile indicates how much variation in removal of thickness from vertically oriented surfaces of the one or more core features is to be applied as a function of radial location on the wafer between a center of the wafer and a peripheral edge of the wafer when performing the target trim amount on the wafer. The target trim amount received in operation 503 can be received on an individual wafer basis or on a wafer lot basis. Similarly, the target trim profile received in operation 505 can be received on an individual wafer basis or on a wafer lot basis.

The method also includes an operation 507 for accessing a first set of data that correlates the amount of trim to one or more plasma trim process parameters. The method also includes an operation 509 for accessing a second set of data that correlates the profile of trim to one or more plasma trim process parameters. The first set of data accessed in the operation 507 and the second set of data accessed in the operation 509 can be developed by performing a design of experiments (DOE). For example, correlations between trim rate and various plasma etch process parameters can be developed from a DOE for a given plasma processing station. Also, correlations between trim profile and various plasma etch process parameters can be developed from a DOE for a given plasma processing station.

The method also includes an operation 511 for determining a set of plasma trim process parameters to be used to achieve the target trim amount and target trim profile on the wafer, where the set of plasma trim process parameters are based on the target trim amount, the target trim profile, the first set of data from operation 507, and the second set of data from operation 509. In some embodiments, a computer program is used to determine/calculate plasma etch process recipe parameters to achieve the target trim amount and the target trim profile for a given wafer in a given plasma processing station based on the corresponding first set of data and second set of data for the given plasma processing station. More specifically, using trim rate versus process parameter data and trim profile versus process parameter data for the given plasma processing station, the computer program determines/calculates the plasma etch process recipe parameters needed to achieve the target trim amount and the target trim profile for the given wafer in the given plasma processing station.

In various embodiments, the set of plasma trim process parameters determined in operation 511 can include essentially any plasma etch process recipe parameter(s), such as process gas type(s) and corresponding flow rate(s), pressure, temperature, radiofrequency (RF) power, RF frequency, bias voltage, among others. In some embodiments, the set of plasma trim process parameters can specify a process gas composition that includes one or more of oxygen ($O_2$), nitrous oxide ($N_2O$), carbon monoxide (CO), carbon dioxide ($CO_2$), ozone ($O_3$), alcohol(s) (including, though not limited to, methanol ($CH_3OH$), ethanol ($C_2H_5OH$), propanol ($CH_3CH_2CH_2OH$), isopropanol ($C_3H_8O$), among other alcohols), and mixtures thereof. Also, in some embodiments, the set of plasma trim process parameters can include specification of an activation source, such as a capacitively coupled plasma (CCP) source, an inductively coupled plasma (ICP) source, a microwave source, a visible ultraviolet (VuV) source, an ozone source, a hot filament source, or another type of activation source. In some embodiments, the set of plasma trim process parameters determined in operation 511 includes a temperature setting within a range extending from about −25° Celsius (C) to about 100° C., or within a range extending from about 0° C. to about 75° C. The method also includes an operation 513 for performing a plasma trim process on the wafer using the set of plasma trim process parameters determined/calculated in operation 511 to create a modified pattern of the core material that includes the one or more core features having a revised critical dimension, e.g., CD2, as measured in the horizontal direction that correspond to the target trim amount and the target trim profile.

In some embodiments, the method includes an operation for measuring values of the critical dimension of the one or more core features on the wafer, and determining the target trim amount and the target trim profile based on the measured values of the critical dimension of the one or more core features. In some embodiments, the target trim amount and the target trim profile are determined to compensate for a WTW variation in the critical dimension of the one or more core features on the wafer. In some embodiments, the target trim amount and the target trim profile are determined to compensate for plasma processing station performance. In some embodiments, the target trim amount and the target trim profile are determined to reduce a non-uniformity in the critical dimension of the one or more core features across the wafer.

In some embodiments, the wafer includes the pattern of the core material formed over a layer of a target material in which device structures are to be formed. For example, the wafer can be prepared for a SADP process. In these embodiments, after performing the plasma trim process on the wafer, a layer of a mask material is deposited conformally over the modified pattern of the core material. Then, the layer of the mask material is etched to form side-spacer structures of the mask material on the core material and to reveal top surfaces of the core material. Then, the core material is removed to leave the side-spacer structures of the mask material above the layer of the target material. Then, the layer of the target material is etched to form the device structures within the target material beneath the side-spacer structures of the mask material. Then, the side-spacer structures of the mask material are removed from the wafer.

In some embodiments, the revised critical dimension of the one or more core features sets a first horizontal spacing between adjacent device structures within the target material. And, a combination of the revised critical dimension of the one or more core features and a horizontal thickness of one of the side-spacer structures of the mask material sets a second horizontal spacing between adjacent device structures within the target material. The first horizontal spacing and the second horizontal spacing occur in an alternating manner between adjacent device structures within the target material. In some embodiments, the target trim amount received in operation 503 and the target trim profile received in operation 505 are set to achieve substantial equality between the first horizontal spacing and the second horizontal spacing across the wafer. In some embodiments, the target trim amount received in the operation 503 and the target trim profile received in the operation 505 are set to partially control a horizontal spacing between device structures within the target material.

In some embodiments, the core features 103 are formed from a layer of a first core material that is formed over a layer of a second core material, with the layer of the second core material formed over a layer of a third core material, and with the layer of the third core material formed over a layer of a target material in which device structures are to be formed. For example, the wafer can be prepared for a SAQP process. In these embodiments, after performing the plasma trim process on the core features 103 in operation 513, the layer of the second core material is etched to form core structures of the second core material beneath the modified pattern of the core features 103. Then, the core features 103 are removed. After the core features 103 are removed, a layer of a first mask material is conformally deposited over the core structures of the second core material. Then, the first mask material is etched to form side-spacers of the first mask material on the core structures of the second core material and to reveal top surfaces of the core structures of the second core material. Then, the core structures of the second core material are removed. After the core structures of the second core material are removed, the layer of the third core material is etched to form core structures of the third core material beneath the side-spacers of the first mask material. Then, the side-spacers of the first mask material are removed. After the side-spacers of the first mask material are removed, a layer of a second mask material is conformally deposited over the core structures of the third core material. Then, the second mask material is etched to form side-spacers of the second mask material on the core structures of the third core material and to reveal top surfaces of the core structures of the third core material. Then, the core structures of the third core material are removed. After, the core structures of the third core material are removed, the layer of the target material is etched to form the device structures within the target material beneath the side-spacers of the second mask material. Then, the side-spacers of the second mask material are removed.

In some embodiments, operation 511 to determine the set of plasma trim process parameters to be used to achieve the target trim amount and target trim profile on the wafer includes determining/calculated a first set of plasma trim process parameters to be used in a base trim process and determining/calculating a second set of plasma trim process parameters to be used in flash trim process. In some embodiments, the second set of plasma trim process parameters, or values thereof, for the flash trim process differs from the first set of plasma trim process parameters for the base trim process. For example, in some embodiments, the second set of plasma trim process parameters for the flash trim process can specify a different process gas composition than what is specified in the first set of plasma trim process parameters for the base trim process. Differences between the second set of plasma trim process parameters for the flash trim process and the first set of plasma trim process parameters for the base trim process can be defined to provide more precise control over the etch amount achieved in the flash trim process as compared to base trim process. For example, the second set of plasma trim process parameters for the flash trim process can specify a process gas composition that provides more precise control over the etch amount achieved in the flash trim process as compared to base trim process.

Also, operation 513 to perform the plasma trim process on the wafer includes performing the base trim process on the wafer using the first set of plasma trim process parameters followed by performing the flash trim process on the wafer using the second set of plasma trim process parameters. In some embodiments, the base trim process is performed in a same manner on different wafers in different plasma processing stations, and the flash trim process differs for different wafers in different plasma processing stations. In some embodiments, the base trim process is performed simultaneously on the different wafers in the different plasma processing stations, and the flash trim process is performed sequentially on the different wafers in the different plasma processing stations.

In some embodiments, multiple wafers are simultaneously processed in respective multiple plasma processing stations, e.g., 340A, 340B, 340C, 340D, of a given multi-station processing tool, e.g., 300. In some embodiments, the base trim process is performed simultaneously on the multiple wafers in the multiple plasma processing stations. Then, the flash trim process for each wafer is performed in its respective plasma processing stations. In some embodiments, the flash trim processes for the multiple wafers are performed in a sequential manner, so that the flash trim process for a particular wafer is performed and completed in its corresponding plasma processing station before the flash trim process for another wafer is performed in its corresponding plasma processing station.

In some embodiments, the method of FIG. 5 for controlling core critical dimension can be included within an overall method that combines the plasma trim process of operation 513 with a deposition process. For example, in some embodiments, the overall method that combines the plasma trim process of operation 513 with the deposition process can include alternating performance of the plasma trim process and the deposition process. In this manner, different on-wafer profiles may be additively coupled in order to yield preferred compensation uniformity profiles. For example, a dish profile plasma trim process of operation 513 may be combined with a dome deposition profile in order to yield a net profile that is differentiated and preferred. Also, in some embodiments, cycling between the plasma trim process of operation 513 and the deposition process can be done two or more times during performance of the overall method, e.g., plasma trim process, followed by deposition process, followed by plasma trim process, followed by deposition process, etc.

FIG. 6 shows a flowchart of a method for controlling core critical dimension, in accordance with some embodiments. The method includes an operation 601 for having multiple wafers, with a pattern of a core material formed on each of the multiple wafers. The pattern of the core material includes core features that have a critical dimension as measured in a horizontal direction, where the horizontal direction is substantially parallel to a bottom surface of a given wafer. The method also includes an operation 603 for receiving a target trim amount as an input parameter for each of the multiple wafers. Each of the multiple wafers has a respective target trim amount. The target trim amount for a particular wafer indicates an average amount of thickness to be removed from vertically oriented surfaces of the core features of the particular wafer. The method also includes an operation 605 for receiving a target trim profile as an input parameter for each of the multiple wafers. Each of the multiple wafers has a respective target trim profile. The target trim profile for the particular wafer indicates how much variation in removal of thickness from the vertically oriented surfaces of the core features is to be applied as a function of radial location on the particular wafer between a center of the particular wafer and a peripheral edge of the particular wafer when performing the target trim amount on the particular wafer.

The method also includes an operation 607 in which, for each of the multiple wafers, a first set of data is accessed that correlates an amount of trim for the particular wafer to one or more plasma trim process parameters. The first set of data is applicable to a specific plasma processing station in which the particular wafer is to be processed. The method also includes an operation 609 in which, for each of the multiple wafers, a second set of data is accessed that correlates a profile of trim for the particular wafer to one or more plasma trim process parameters. The second set of data is applicable to the specific plasma processing station in which the particular wafer is to be processed.

The method also includes an operation 611 for determining a base set of plasma trim process parameters for use in a base trim process on each of the multiple wafers, where the base trim process is the same for each of the multiple wafers. The determination of the base set of plasma trim process parameter in operation 611 is based on the target trim amount for each of the multiple wafers, the target trim profile for each of the multiple wafers, the first set of data for the plasma processing stations, and the second set of data for the plasma processing stations. In some embodiments, the base trim process is defined to address WTW CDNU. In various embodiments, the base set of plasma trim process parameters determined in operation 611 can include essentially any plasma etch process recipe parameter(s), such as the parameters previously mentioned with regard to operation 511 in the method of FIG. 5. The method also includes an operation 613 for determining a respective supplemental set of plasma trim process parameters for each of the multiple wafers for use in a respective flash trim process on each of the multiple wafers to achieve the target trim amount for the particular wafer and target trim profile for the particular wafer, where the flash trim process is customized for each of the multiple wafers. The determination of the respective supplemental set of plasma trim process parameters in operation 613 is based on the target trim amount for each of the multiple wafers, the target trim profile for each of the multiple wafers, the first set of data for the plasma processing stations, the second set of data for the plasma processing stations, and the base set of plasma trim process parameters. In some embodiments, the flash trim process is defined to address WTW radial CD variation across the wafer. In various embodiments, the supplemental set of plasma trim process parameters determined in operation 613 can include essentially any plasma etch process recipe parameter(s), such as the parameters previously mentioned with regard to operation 511 in the method of FIG. 5.

In some embodiments, the supplemental set of plasma trim process parameters determined in operation 613, or values thereof, can differ from the base set of plasma trim process parameters determined in operation 611. For example, in some embodiments, the supplemental set of plasma trim process parameters for the flash trim process can specify a different process gas composition than what is specified in the base set of plasma trim process parameters for the base trim process. Differences between the supplemental set of plasma trim process parameters for the flash trim process and the base set of plasma trim process parameters for the base trim process can be defined to provide more precise control over the etch amount achieved in the flash trim process as compared to base trim process. For example, the supplemental set of plasma trim process parameters for the flash trim process can specify a process gas composition that provides more precise control over the etch amount achieved in the flash trim process as compared to base trim process.

The method also includes an operation 615 for performing the base trim process on each of the multiple wafers in the specific plasma processing station in which the particular wafer is to be processed. The method also includes an operation 617 in which, after completion of the base trim process, the respective flash trim process is performed on each of the multiple wafers in the specific plasma processing station in which the particular wafer is to be processed. In some embodiments, the base trim process is performed in a simultaneous manner on each of the multiple wafers, and the flash trim process is performed in a sequential manner on different ones of the multiple wafers.

In some embodiments, the method of FIG. 6 for controlling core critical dimension can be included within an overall method that combines the base trim process of operation 615 and the flash trim process of operation 617 with a deposition process. For example, in some embodiments, the overall method that combines the base trim process of operation 615 and the flash trim process of operation 617 with the deposition process can include alternating performance of the combination of the base trim process and the flash trim process with performance of the deposition process. In this manner, different on-wafer profiles may be additively coupled in order to yield preferred compensation uniformity profiles. For example, a combination of the base trim process and the flash trim process that provides a dish profile may be combined with a dome deposition profile in order to yield a net profile that is differentiated and preferred. Also, in some embodiments, cycling between the base trim process and flash trim process combination and the deposition process can be done two or more times during performance of the overall method, e.g., base/flash trim process, followed by deposition process, followed by base/flash trim process, followed by deposition process, etc.

Figure 7:
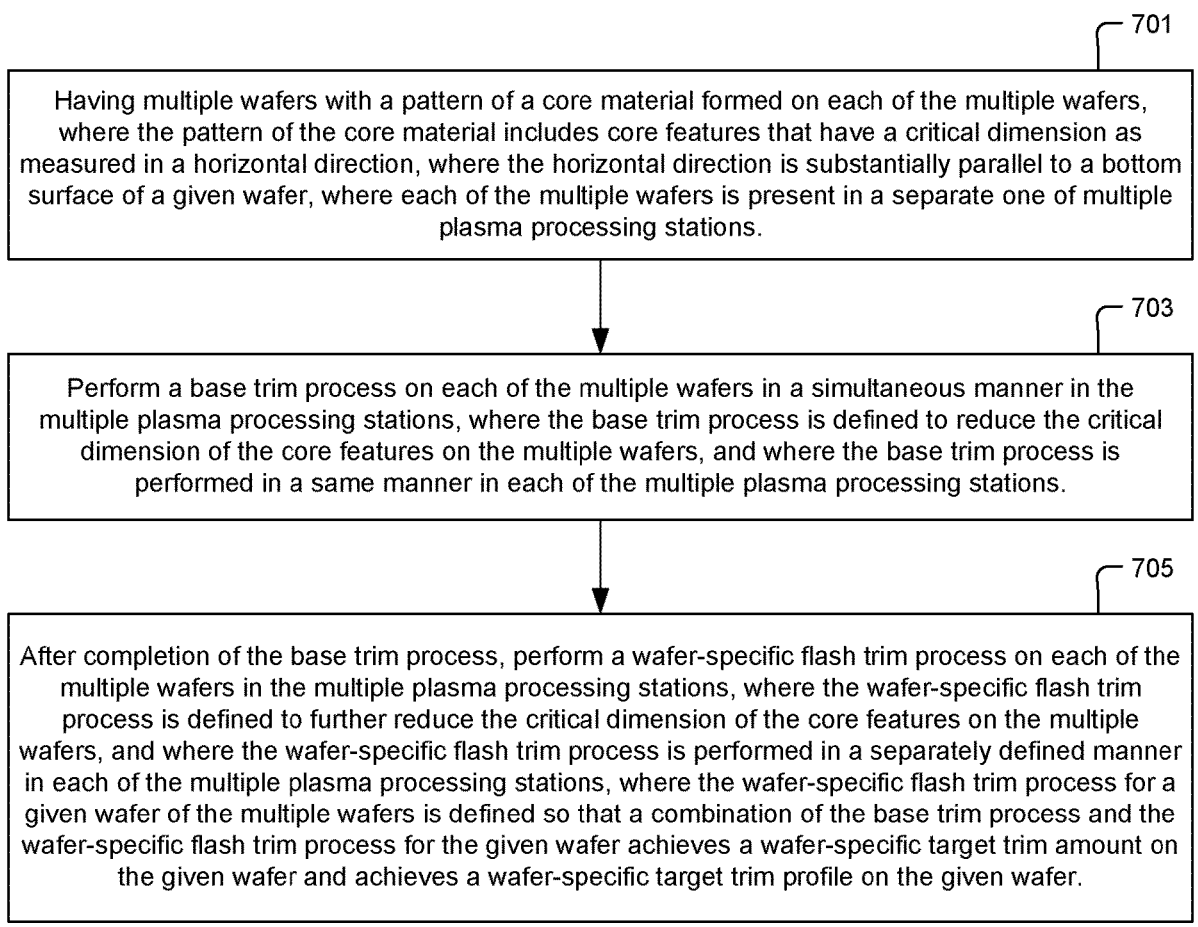
FIG. 7 shows a method for controlling core critical dimension on multiple wafers, in accordance with some embodiments.

FIG. 7 shows a method for controlling core critical dimension on multiple wafers, in accordance with some embodiments. The method includes an operation 701 for having multiple wafers, with a pattern of a core material formed on each of the multiple wafers. The pattern of the core material includes core features that have a critical dimension as measured in a horizontal direction, where the horizontal direction is substantially parallel to a bottom surface of a given wafer. Each of the multiple wafers is present in a separate one of multiple plasma processing stations. The method also includes an operation 703 for performing a base trim process on each of the multiple wafers in a simultaneous manner in the multiple plasma processing stations. The base trim process is defined to reduce the critical dimension of the core features on the multiple wafers. The base trim process is performed in a same manner in each of the multiple plasma processing stations. The method also includes an operation 705 in which, after completion of the base trim process, a wafer-specific flash trim process is performed on each of the multiple wafers in the multiple plasma processing stations. The wafer-specific flash trim process is defined to further reduce the critical dimension of the core features on the multiple wafers. The wafer-specific flash trim process is performed in a separately defined manner in each of the multiple plasma processing stations. The wafer-specific flash trim process for a given wafer of the multiple wafers is defined so that a combination of the base trim process and the wafer-specific flash trim process for the given wafer achieves a wafer-specific target trim amount on the given wafer and achieves a wafer-specific target trim profile on the given wafer. In some embodiments, the wafer-specific flash trim process is performed in a sequential manner on the multiple wafers in the multiple plasma processing stations so that one of the multiple plasma processing stations is operating at a given time to perform the wafer-specific flash trim process.

In some embodiments, the wafer-specific target trim amount and the wafer-specific target trim profile are received as input parameters for each of the multiple wafers. And, a station-specific trim rate performance as a function of one or more plasma process parameters is received as an input parameter for each of the multiple plasma processing stations. And, a station-specific trim profile performance as a function of one or more plasma process parameters is received as an input parameter for each of the multiple plasma processing stations. And, the method further includes determining specifications of the base trim process and the wafer-specific flash trim process for each of the multiple wafers in the respective multiple plasma processing stations using the wafer-specific target trim amount, the wafer-specific target trim profile, the station-specific trim rate performance, and the station-specific trim profile performance. In various embodiments, the specifications of the base trim process and the wafer-specific flash trim process for each of the multiple wafers can include essentially any plasma etch process recipe parameter(s), such as the parameters previously mentioned with regard to operation 511 in the method of FIG. 5.

To further illustrate the methods of FIGS. 6 and 7, consider an example in which four wafers are to be processed in a four-station tool that includes four plasma processing stations. The target trim amounts for the four wafers are 78 angstroms for wafer 1, 79 angstroms for wafer 2, 76 angstroms for wafer 3, and 77 angstroms for wafer 4. Also, the target trim profiles for the four wafers are specified in terms of P2%. The P2% is defined as the difference between the average critical dimension value for the central region of the wafer and the average critical dimension value for the outer radial region of the wafer. The target trim amounts and the target trim profiles for the four wafers are provided to a computer program to determine the specifications of the base trim process and the specifications of the flash trim process for each of the four wafers. The computer program also has access to a first set of data that provides station-specific trim rate performance as a function of one or more plasma process parameters, e.g., etch rate as a function of one or more process parameters for each plasma processing station. Also, the computer program has access to a second set of data that provides station-specific trim profile performance as a function of one or more plasma process parameters, e.g., P2% as a function of one or more plasma process parameters for each plasma processing station. In the first and second data sets, the one or more plasma processing parameters can include essentially any plasma etching process recipe parameters, such as process gas type(s) and corresponding flow rate(s), pressure, temperature, radiofrequency (RF) power, RF frequency, bias voltage, among others. Based on the target trim amounts and the target trim profiles for the four wafers and the first and second sets of data, the computer program determines the specifications of the base trim process to be performed in an equivalent manner on all four wafers. For example, the specifications of the base trim process can be set to trim 74 angstroms with a common trim profile (P2%) on all four wafers. And, based on the target trim amounts and the target trim profiles for the four wafers and the first and second sets of data, the computer program determines the specifications of the flash trim process to be performed on each of the four wafers. For example, the flash trim process for wafer 1 is defined to trim 4 additional angstroms. The flash trim process for wafer 2 is defined to trim 5 additional angstroms. The flash trim process for wafer 3 is defined to trim 2 additional angstroms. The flash trim process for wafer 4 is defined to trim 3 additional angstroms. The trim profile (P2%) used in the flash trim process for each wafer can be customized to achieve the target trim profile for each wafer.

In some embodiments, the base trim process is simultaneously performed on all four wafers. Then, the flash trim process is performed in a sequential manner on the four wafers, i.e., on wafer 1, then on wafer 2, then on wafer 3, then on wafer 4. In some embodiments, if the plasma processing stations can operate in a fully independent manner, e.g., such as with separate and independently controllable power supplies and gas supplies, then the flash trim processes can also be performed in a simultaneously manner.

Figure 8:
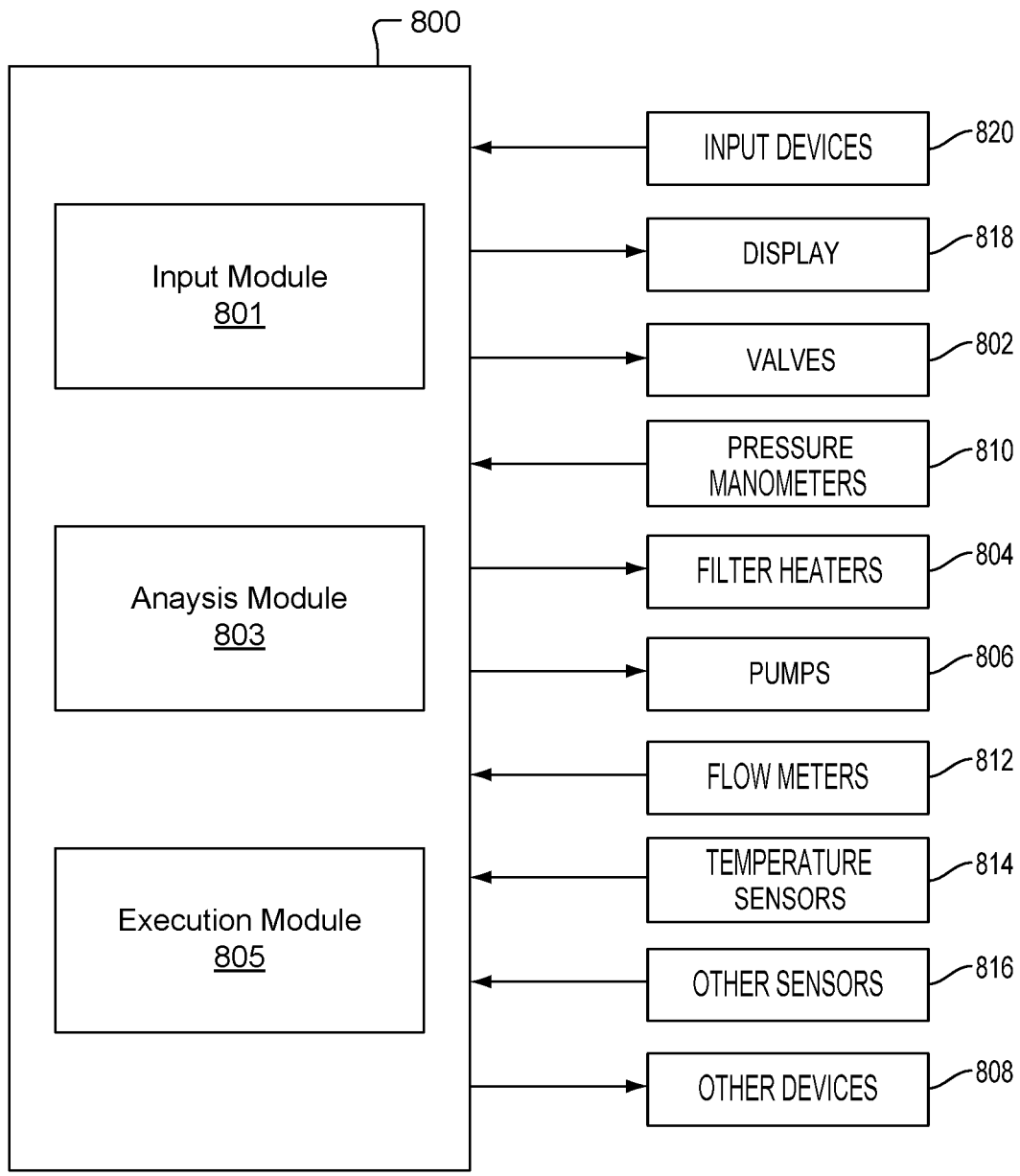
FIG. 8 shows a controller for controlling core critical dimension, in accordance with some embodiments.

FIG. 8 shows a controller 800 for controlling core critical dimension, in accordance with some embodiments. In some embodiments, the controller 800 can be implemented within the probe control and system control 210 of FIG. 2 and/or within the controller 420 of FIG. 4. And, in some embodiments, the controller 800 can be implemented separately and provide output to the process input and control 208 of FIG. 2. The controller 800 includes an input module 801, an analysis module 803, and an execution module 805. The input module 801 is configured to obtain a target trim amount as an input parameter. The target trim amount indicates an average amount of thickness to be removed from vertically oriented surfaces of core features on a wafer. The core features form part of a pattern of a core material on the wafer. The core features have a critical dimension as measured in a horizontal direction parallel to a bottom surface of the wafer. The input module 801 is configured to obtain a target trim profile as an input parameter. The target trim profile indicates how much variation in removal of thickness from vertically oriented surfaces of the core features is to be applied as a function of radial location on the wafer between a center of the wafer and a peripheral edge of the wafer when performing the target trim amount on the wafer. In some embodiments, the input module 801 is configured to obtain measured values of the critical dimension of the core features on the wafer, and determine the target trim amount and the target trim profile based on the measured values the critical dimension of the core features. The input module 801 is configured to obtain a first set of data that correlates an amount of trim to one or more plasma trim process parameters. The input module 801 is also configured to obtain a second set of data that correlates a profile of trim to one or more plasma trim process parameters.

The analysis module 803 is configured to determine a set of plasma trim process parameters to be used to achieve the target trim amount and target trim profile on the wafer based on analysis of the first set of data and the second set of data. The execution module 805 is configured to direct performance of a plasma trim process on the wafer using the set of plasma trim process parameters to create a modified pattern of the core material that includes the core features having a revised critical dimension as measured in the horizontal direction.

In some embodiments, the input module 801 is configured to obtain the target trim amount and the target trim profile as input parameters for multiple wafers, where each of the multiple wafers has a separate target trim amount and a separate target trim profile. Also, the input module 801 is configured to obtain the first set of data and the second set of data for each of multiple plasma processing stations. The analysis module 803 is configured to analyze the target trim amount for each of the multiple wafers, the target trim profile for each of the multiple wafers, the first set of data for each of the multiple plasma processing stations, and the second set of data for each of the multiple plasma processing stations to determine a base set of plasma trim process parameters for use in a base trim process on each of the multiple wafers in a corresponding one of the multiple plasma processing stations. The base trim process is the same for each of the multiple wafers. Also, the analysis module 803 is configured to analyze the target trim amount for each of the multiple wafers, the target trim profile for each of the multiple wafers, the first set of data for each of the multiple plasma processing stations, the second set of data for each of the multiple plasma processing stations, and the base set of plasma trim process parameters to determine a respective supplemental set of plasma trim process parameters for each of the multiple wafers for use in a respective flash trim process on each of the multiple wafers in the corresponding one of the multiple plasma processing stations to achieve the target trim amount for the particular wafer and target trim profile for the particular wafer. The flash trim process is customized for each of the multiple wafers. The execution module 805 is configured to direct performance of the base trim process on each of the multiple wafers in the corresponding plasma processing station. And, the execution module 805 is configured to direct performance of the flash trim process on each of the multiple wafers in the corresponding plasma processing station after completion of the base trim process.

In various embodiments, the controller 800 may include a processor, memory and one or more interfaces. The controller 800 may be employed to control devices in the plasma processing station(s) based in-part on sensed values. For example, the controller 800 may control one or more of valves 802, filter heaters 804, pumps 806, and other devices 808 based on the sensed values and other control parameters. The controller 800 receives the sensed values from, for example, pressure manometers 810, flow meters 812, temperature sensors 814, and/or other sensors 816. The controller 800 may also be employed to control process conditions during etching and deposition on the wafer(s). The controller 800 can include one or more memory devices and one or more computer processors.

The controller 800 may control activities associated with the core trim process in a given plasma processing station. The controller 800 executes computer programs including sets of instructions for controlling process timing, process gas delivery system temperature, and pressure differentials, valve positions, mixture of gases, process gas flow rate, chamber pressure, chamber temperature, substrate temperature, RF power levels, substrate chuck or pedestal position, bias power, and other parameters of a particular process. Other computer programs stored on memory devices associated with the controller 800 may be employed in some embodiments. Typically there will be a user interface associated with the controller 800. The user interface may include a display 818 (e.g., a display screen and/or graphical software displays of the apparatus and/or process conditions), and user input devices 820 such as pointing devices, keyboards, touch screens, microphones, etc.

Computer programs for controlling the core trim process and other processes in a process sequence can be written in any conventional computer readable programming language: for example, assembly language, C, C++, Pascal, Fortran or others. Compiled object code or script is executed by the processor to perform the tasks identified in the program. The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature. The system software may be designed or configured in many different ways. For example, various chamber component subroutines or control objects may be written to control operation of the chamber components necessary to carry out the core trim processes disclosed herein.

Examples of sensors that may be monitored during the core trim process include, but are not limited to, mass flow control modules, pressure sensors such as the pressure manometers 810, and thermocouples located in delivery system, the pedestal or chuck (e.g., the temperature sensors 814/220). Appropriately programmed feedback and control algorithms may be used with data from these sensors to maintain desired process conditions. The foregoing describes implementation of embodiments of the disclosure in a single or multi-chamber semiconductor processing tool.

In some implementations, the controller 800 is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The controller 800 may control various components or subparts of the system or systems. The controller 800, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller 800 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 800 in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 800, in some implementations, may be a part of or coupled to a computer that is integrated with, coupled to the system, otherwise networked to the system, or a combination thereof. For example, the controller 800 may be in the "cloud" of all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet.

The remote computer may include a user interface that enables entry or programming of parameters and/or settings, which are then communicated to the system from the remote computer. In some examples, the controller 800 receives instructions in the form of data, which specify parameters for each of the processing steps to be performed during one or more operations. It should be understood that the parameters may be specific to the type of process to be performed and the type of tool that the controller 800 is configured to interface with or control. Thus as described above, the controller 800 may be distributed, such as by comprising one or more discrete controllers that are networked together and working towards a common purpose, such as the processes and controls described herein. An example of a distributed controller for such purposes would be one or more integrated circuits on a plasma processing station in communication with one or more integrated circuits located remotely (such as at the platform level or as part of a remote computer) that combine to control a process on the plasma processing station.

Without limitation, example systems that the controller 800 can interface with may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 800 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Double patterning (DPT) processes, such as SADP, that use a sacrificial spacer layer have been used to fabricate semiconductor chips at recent technology nodes, e.g., 45 nanometer and below. One of the biggest challenges in DPT processes is obtaining tight control on WiW and WTW variability of CDNU and CDIMB. One of the main causes of WiW and WTW CDNU and CDIMB is photolithography. The core trim process is used between the photolithography process (in which the core mandrel is formed) and the side-spacer deposition process to further reduce the critical dimension of the core features. A primary objective of the core trim process is to reduce the critical dimension of the core features of the patterned core mandrel. However, as demonstrated by the methods and systems disclosed herein, the core trim process can also be used to compensate for incoming WiW and WTW critical dimension differences. As disclosed herein, a flash trim process is provided in which it is possible to individually control the core feature trim amount, trim profile, and CDNU at each plasma processing station. The flash trim process is implemented by first analyzing the incoming critical dimension metrology for WiW and WTW CDNU. Wafers are then processed by the common base trim process across multiple plasma processing stations. After the common base trim process, the flash trim process is performed on each wafer to compensate for core feature trim amount, trim profile, and CDNU on each plasma processing station based on the incoming critical dimension metrology data.

Current double patterning technology suffers from issues such as CDNU and CDIMB. Prior to the methods and systems disclosed herein, there was not a viable solution for mitigating/reducing/eliminating CDNU and CDIMB. In a SADP spacer deposition method, CDNU and CDIMB is a result of both core photolithography non-uniformity and side-wall spacer thickness non-uniformity. The methods and systems disclosed herein provide for control of the core trim step in the SADP process to improve WTW or WiW critical dimension variability. Specifically, the flash trim process disclosed herein provides flexibility to improve WTW variation in critical dimension and enable WTW CDNU control. The methods and systems disclosed herein provide wafer level control on critical dimension and CDNU.

Prior to the methods and systems disclosed herein, in the SADP process, critical dimension and CDNU was determined by how well core photolithography non-uniformity could be controlled and by how well side-spacer thickness could be controlled. The methods and systems disclosed herein realize that the core feature trim step can affect core critical dimension and can help modulate both core critical dimension and gap critical dimension. Therefore, by providing a flexible control on the core trim process, the methods and systems disclosed herein provide for improvement in control of WTW critical dimension and WTW CDNU.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing disclosure has been presented in some detail for purposes of clarity of understanding, it will be apparent that certain changes and modifications can be practiced within the scope of the embodiments disclosed herein. Accordingly, the present embodiments are to be considered as illustrative and not restrictive, and the disclosure is not to be limited to the details given herein, but may be modified within the scope and equivalents of the described embodiments.

What is claimed is:

1. A controller for controlling core critical dimension, comprising:
    an input module configured to obtain a target trim amount as a first input parameter, the target trim amount indicating an average amount of thickness to be removed from vertically oriented surfaces of one or more core features on a wafer, the one or more core features forming part of a pattern of a core material on the wafer, the one or more core features having a critical dimension as measured in a horizontal direction parallel to a bottom surface of the wafer,
    the input module configured to obtain a target trim profile as a second input parameter, the target trim profile indicating how much variation in removal of thickness from the vertically oriented surfaces of the one or more core features is to be applied as a function of radial location on the wafer between a center of the wafer and a peripheral edge of the wafer when performing the target trim amount on the wafer,
    the input module configured to obtain a first set of data that correlates an amount of trim to a first set of one or more plasma trim process parameters,
    the input module configured to obtain a second set of data that correlates a profile of trim to a second set of one or more plasma trim process parameters;
    an analysis module configured to determine a third set of plasma trim process parameters to be used to achieve the target trim amount and the target trim profile on the wafer based on analysis of the target trim amount, the target trim profile, the first set of data, and the second set of data; and
    an execution module configured to direct performance of a plasma trim process on the wafer using the third set of plasma trim process parameters to create a modified pattern of the core material that includes the one or more core features having a revised critical dimension as measured in the horizontal direction.

2. The controller as recited in claim 1, wherein the input module is configured to obtain measured values of the critical dimension of the one or more core features on the wafer, and wherein the input module is configured to determine the target trim amount and the target trim profile based on the measured values of the critical dimension of the one or more core features.

3. The controller as recited in claim 2, wherein the target trim amount and the target trim profile are determined to compensate for a wafer-to-wafer variation in the critical dimension of the one or more core features on the wafer.

4. The controller as recited in claim 2, wherein the target trim amount and the target trim profile are determined to compensate for plasma processing station performance.

5. The controller as recited in claim 2, wherein the target trim amount and the target trim profile are determined to reduce a non-uniformity in the critical dimension of the one or more core features across the wafer.

6. The controller as recited in claim 1, wherein the input module is configured to obtain the target trim amount and the target trim profile as input parameters for multiple wafers, wherein each of the multiple wafers has a separate target trim amount and a separate target trim profile,
    wherein the input module is configured to obtain the first set of data and the second set of data for each of multiple plasma processing stations,
    wherein the analysis module is configured to analyze the target trim amount for each of the multiple wafers, the target trim profile for each of the multiple wafers, the first set of data for each of the multiple plasma processing stations, and the second set of data for each of the multiple plasma processing stations to determine a base set of plasma trim process parameters for use in a base trim process on each of the multiple wafers in a corresponding one of the multiple plasma processing stations, wherein the base trim process is the same for each of the multiple wafers, and
    wherein the execution module is configured to direct performance of the base trim process on each of the multiple wafers in the corresponding plasma processing station.

7. The controller as recited in claim 6, wherein the analysis module is configured to analyze the target trim amount for each of the multiple wafers, the target trim profile for each of the multiple wafers, the first set of data for each of the multiple plasma processing stations, the second set of data for each of the multiple plasma processing stations, and the base set of plasma trim process parameters to determine a respective supplemental set of plasma trim process parameters for each of the multiple wafers for use in a respective flash trim process on each of the multiple wafers in the corresponding one of the multiple plasma processing stations to achieve the target trim amount for the particular wafer and the target trim profile for the particular wafer, wherein the flash trim process is customized for each of the multiple wafers, and wherein the execution module is configured to direct performance of the flash trim process on each of the multiple wafers in the corresponding plasma processing station after completion of the base trim process.

8. The controller as recited in claim 7, wherein the base trim process is performed simultaneously on the multiple wafers in the multiple plasma processing stations, and wherein the flash trim process is performed sequentially on each of the multiple wafers in the corresponding plasma processing station.

9. The controller as recited in claim 1, wherein the wafer includes the pattern of the core material formed over a layer of a target material in which device structures are to be formed.

10. The controller as recited in claim 9, wherein the controller is configured to:

direct deposition of a layer of a mask material conformally over the modified pattern of the core material after the plasma trim process is performed on the wafer, direct etching of the layer of the mask material to form side-spacer structures of the mask material on the core material and to reveal top surfaces of the core material, direct removal of the core material to leave the side-spacer structures of the mask material above the layer of the target material, direct etching of the layer of the target material to form the device structures within the target material beneath the side-spacer structures of the mask material, and direct removal of the side-spacer structures of the mask material.

11. The controller as recited in claim 10, wherein the revised critical dimension of the one or more core features sets a first horizontal spacing between adjacent device structures within the target material, wherein a combination of the revised critical dimension of the one or more core features and a horizontal thickness of one of the side-spacer structures of the mask material sets a second horizontal spacing between adjacent device structures within the target material, and wherein the first horizontal spacing and the second horizontal spacing occur in an alternating manner between adjacent device structures within the target material.

12. The controller as recited in claim 11, wherein the target trim amount and the target trim profile are set to achieve substantial equality between the first horizontal spacing and the second horizontal spacing across the wafer.

13. The controller as recited in claim 9, wherein the target trim amount and the target trim profile are set to partially control a horizontal spacing between device structures within the target material.

14. The controller as recited in claim 1, wherein the pattern of the core material is formed from a layer of a first core material, wherein the wafer includes the pattern of the core material formed over a layer of a second core material, wherein the layer of the second core material is formed over a layer of a third core material, wherein the layer of the third core material is formed over a layer of a target material in which device structures are to be formed.

15. The controller as recited in claim 14, wherein the controller is configured to:

direct etching the layer of the second core material after the plasma trim process is performed on the wafer, wherein etching of the layer of the second core material is done to form core structures of the second core material beneath the modified pattern of the core material formed from the layer of the first core material, direct removal of the first core material, direct deposition of a layer of a first mask material conformally over the core structures of the second core material, direct etching of the first mask material to form side-spacers of the first mask material on the core structures of the second core material and to reveal top surfaces of the core structures of the second core material, direct removal of the core structures of the second core material, direct etching the layer of the third core material to form core structures of the third core material beneath the side-spacers of the first mask material, direct removal of the side-spacers of the first mask material, direct deposition of a layer of a second mask material conformally over the core structures of the third core material, direct etching of the second mask material to form side-spacers of the second mask material on the core structures of the third core material and to reveal top surfaces of the core structures of the third core material, direct removal of the core structures of the third core material, direct etching of the layer of the target material to form the device structures within the target material beneath the side-spacers of the second mask material, and direct removal of the side-spacers of the second mask material.

16. A controller for controlling core critical dimension, comprising:

an input module configured to obtain a target trim amount as an input parameter, the target trim amount indicating an average amount of thickness to be removed from vertically oriented surfaces of one or more core features on a wafer, the one or more core features forming part of a pattern of a core material on the wafer, the one or more core features having a critical dimension as measured in a horizontal direction parallel to a bottom surface of the wafer, the input module configured to obtain a first set of data that correlates an amount of trim to a first set of one or more plasma trim process parameters;

an analysis module configured to use the target trim amount and the first set of data to determine a base trim set of plasma trim process parameters to be used in a base trim process and a flash trim set of plasma trim process parameters to be used in a flash trim process, wherein a combination of the base trim process and the flash trim process achieve the target trim amount on the wafer; and an execution module configured to direct performance of the base trim process on the wafer using the base trim set of plasma trim process parameters and the flash trim process on the wafer using the flash trim set of plasma trim process parameters to create a modified pattern of the core material that includes the one or more core features having a revised critical dimension as measured in the horizontal direction.

17. The controller as recited in claim 16, wherein the input module is configured to obtain measured values of the critical dimension of the one or more core features on the wafer, and wherein the input module is configured to determine the target trim amount based on the measured values of the critical dimension of the one or more core features.

18. The controller as recited in claim 17, wherein the target trim amount is determined to compensate for a wafer-to-wafer variation in the critical dimension of the one or more core features on the wafer.

19. The controller as recited in claim 17, wherein the target trim amount is determined to compensate for plasma processing station performance.

20. The controller as recited in claim 17, wherein the target trim amount is determined to reduce a non-uniformity in the critical dimension of the one or more core features across the wafer.

* * * * *